(12) United States Patent
Menkhoff

(10) Patent No.: US 6,822,692 B2
(45) Date of Patent: Nov. 23, 2004

(54) DIGITAL FILTER

(75) Inventor: Andreas Menkhoff, München (DE)

(73) Assignee: Infineon Technologies AG, Munich (DE)

( * ) Notice: Subject to any disclaimer, the term of this patent is extended or adjusted under 35 U.S.C. 154(b) by 362 days.

(21) Appl. No.: 09/944,162

(22) Filed: Aug. 30, 2001

(65) Prior Publication Data

US 2002/0113897 A1 Aug. 22, 2002

(30) Foreign Application Priority Data

Aug. 31, 2000 (DE) .......................................... 100 42 930

(51) Int. Cl.[7] .............................................. H03L 7/00
(52) U.S. Cl. ...................... 348/537; 348/470; 348/536
(58) Field of Search ................................. 348/537, 536, 348/470; 375/232, 233, 230, 152; 708/313, 319; 329/336; H03L 47/00

(56) References Cited

U.S. PATENT DOCUMENTS 4,368,434 A * 1/1983 Miller et al. ................ 329/336
4,866,647 A * 9/1989 Farrow ........................ 708/313
5,351,205 A * 9/1994 Hoos ........................... 708/300
5,473,686 A * 12/1995 Virdee .................... 379/406.08
5,481,564 A * 1/1996 Kakuishi et al. ............. 375/230
5,636,151 A   6/1997 Ikeda .................... 364/724.19
6,055,269 A * 4/2000 Drost et al. .................. 375/232
6,563,511 B1 * 5/2003 Yeh et al. .................... 345/611

FOREIGN PATENT DOCUMENTS

DE            19829290 A1       1/2000

OTHER PUBLICATIONS

Schenk, U. Tietze Ch., "Halbleiter–Schaltungstechnik", Achte, uberarbeitete Auflage, Springer–Verlag, 1986, 3 pages.

* cited by examiner

*Primary Examiner*—Michael H. Lee
*Assistant Examiner*—Trang U. Tran
(74) *Attorney, Agent, or Firm*—Fish & Richardson P.C.

(57) ABSTRACT

Digital filter for filtering a digital input signal with a variable filter length (l), it being possible to switch over the filter length (l) of the digital filter (8) as a function of a variable input clock frequency ($f_{in}$) of the digital input signal without the ratio between the input clock frequency ($f_{in}$) and an output clock frequency ($f_{out}$) of the filtered digital output signal which is output by the digital filter (8) changing.

12 Claims, 7 Drawing Sheets

DIGITAL FILTER

The invention relates to a digital filter for filtering a digital input signal, in particular QAM- and QPSK-modulated input signals.

In many technical applications, there is a need for signal receivers which can process both digital input signals with a high input clock frequency and sampling frequency and input signals with a low input clock frequency and sampling frequency. An example of this is a digital television receiver (DVB) which can receive both a high-frequency 4 QAM signal which is subject to noise and which is transmitted via satellite, and a low-frequency relatively noise-free 256 QAM signal which is transmitted via cable.

FIG. 1 shows a block circuit diagram of a television receiver according to the prior art. The television receiver receives the 4 QAM-modulated signal which is subject to noise and is transmitted by a satellite via a first input Esat, and the television receiver receives the relatively noise-free 256 QAM-modulated cable input signal via the second input $E_{cable}$. The satellite input signal has, for example, a symbol rate $f_{symbol}$ of 24 megasymbols per second, each symbol being 4 QAM-modulated, i.e. having two bits. The 256 QAM-modulated cable input signal has, for example, a symbol rate $f_{symbol}$ of 6 megasymbols per second, each data symbol having a data bit width of 8 bits.

The following applies for the input clock frequency of the input signal and/or for the input data rate DR:

$$DR = f_{symbol} \cdot \text{symbol bit width} \qquad (1)$$

to which the following applies:

|  | 4 QAM (satellite) | 256 QAM (cable) |
| --- | --- | --- |
| $f_{symbol}$ | 24 M $\frac{symb}{sec}$ | 6 M $\frac{symb}{sec}$ |
| Symbol bit width | 2 bit | 8 bit |
| DR | 48 $\frac{Mbit}{sec}$ | 48 $\frac{Mbit}{sec}$ |
| $F_{clock}$ | 48 MHz | 12 MHz |

For the high-frequency satellite signal (4 QAM), circuits with a high sampling frequency and simple filters with a low filter length are used in the receiver, while for the low-frequency cable signal (256 QAM) circuits with a low sampling frequency and complex filters with a high filter length are used in the receiver. In the example shown in FIG. 1, the filter A has, for the high-frequency satellite input signal, a filter length N1 which is significantly smaller than the filter length N2 of the digital filter B for the cable input signal. In the conventional receiver, the output signals of the two digital filters A, B are fed to a controllable switching device S which in each case outputs an output signal of a filter A, B to a downstream data processing unit DV for further data processing. A television receiver TV is connected to the output of the data processing unit DV.

The digital filters A, B shown in FIG. 1 typically each have the circuit structure shown in FIG. 2. The two digital filters A, B are each composed here of registers Z1, Z2 to Zn which are connected in series and whose outputs are connected to multipliers M1 to Mn for multiplication by filter coefficients K1 to Kn. The outputs of the multipliers M1 to Mn are connected to adders A1 to An-1 which are connected in series to one another. The registers Z1 to Zn are clocked with a sampling frequency $f_{clock}$, the following applying:

$$f_{clock} \geq f_{symbol} \qquad (3)$$

For f-clock-symbol, the digital filter A for the high-frequency satellite signal thus has a clock frequency $f_{TA}$ of 48 MHz, and a clock frequency $f_{TB}$ of 12 MHz is sufficient for the filter B for the low-frequency cable input signal.

In order to minimize the expenditure on circuitry, the filter lengths of the two digital filters A, B depend on the chip clock frequency $f_{chip}$ and on the clock frequency $f_{clock}$:

$$n = \frac{f_{chip}}{f_{clock}} \qquad (4)$$

Given a chip clock frequency $f_{chip}$ of, for example, 240 MHz, with the values given in the table for the clock frequencies $f_{clock}$ the filter lengths for the two digital filters A, B, as illustrated in FIG. 1, are obtained as:

$$n_A = \frac{240 \text{ MHz}}{48 \text{ MHz}} = 5 \qquad (5)$$

$$n_B = \frac{240 \text{ MHz}}{12 \text{ MHz}} = 20$$

The filter B for filtering the cable input signal has a large filter length n=20, so that the digital filter B can be implemented with only a very high degree of expenditure on circuitry. As is apparent from FIG. 2, such a filter B requires 20 registers and 20 multiplication circuits M1 to M20, the multiplier circuits M1 to M20 in particular requiring a high degree of expenditure on circuitry.

A further disadvantage of the receiver circuit shown in FIG. 1 according to the prior art is that the two digital filters A, B have permanently predefined filter lengths, n, and thus are inflexible toward changes in the type of modulation.

The object of the present invention is therefore to provide a digital filter for filtering a digital input signal which is suitable for filtering digital input signals which are modulated in different ways, and which can be implemented with a low degree of expenditure of circuitry.

This object is achieved according to the invention by means of a digital filter having the features disclosed in patent claim 1.

The invention provides a digital filter for filtering a digital input signal with a variable filter length, it being possible to switch over the filter length of the digital filter as a function of a variable input clock frequency of the digital input signal without the ratio of input clock frequency to an output clock frequency of the filtered digital output signal which is output by the digital filter changing.

The digital filter according to the invention provides the advantage that it always supplies an output signal which has a constant output clock frequency and which can be fed directly to a further data processing means without adaptation circuits.

The digital filter is preferably of modular design composed of at least one digital filter module.

Here, the digital filter module is preferably composed of a filter coefficient circuit for outputting filter coefficients to a multiplier device which multiplies the filter coefficients output by the filter coefficient circuit by an input data signal which is present at a first input of the digital filter module, an adder circuit for adding the signal output by the multiplier device to a demultiplexer output signal which is output by a demultiplexer output of a first demultiplexer, and a register circuit which is composed of a plurality of registers which are connected in series, the outputs of the registers each being connected to an input of the first demultiplexer.

The digital filter module according to the invention merely requires a multiplier device, and can thus be implemented very easily in terms of circuitry.

In a first embodiment of the digital filter according to the invention, the filter modules are connected in parallel with one another.

In an alternative embodiment of the digital filter according to the invention, the digital filter modules are connected in series.

The digital filter modules are preferably controlled by a central control circuit.

The digital filter module according to the invention preferably has a controllable switch for reading out the demultiplexer output signal of the first demultiplexer to a signal output of the digital filter module.

The digital filter module also preferably has a controllable resetting circuit for resetting the demultiplexer output signal at the demultiplexer output of the first demultiplexer.

In a particularly preferred embodiment, the digital filter module has a second demultiplexer with two demultiplexer inputs and a demultiplexer output, the first demultiplexer input being connected to a second input of the digital filter module, the second demultiplexer input being connected to an output of the resetting circuit and the demultiplexer output of the second demultiplexer being connected to the adder circuit.

In a first embodiment of the digital filter module according to the invention, the filter coefficient circuit is a filter coefficient generating circuit for generating the filter coefficients.

In an alternative embodiment of the filter module according to the invention, the filter coefficient circuit is composed of a plurality of switchable memories, in each of which a filter coefficient set composed of a plurality of filter coefficients is stored.

The digital input signal filtered by the digital filter is preferably a modulated QAM signal or a QPSK signal.

The digital filter is preferably used in a DVB television receiver.

Preferred embodiments of the digital filter according to the invention are described below with reference to the appended figures explaining features which are essential to the invention.

Figure 1:
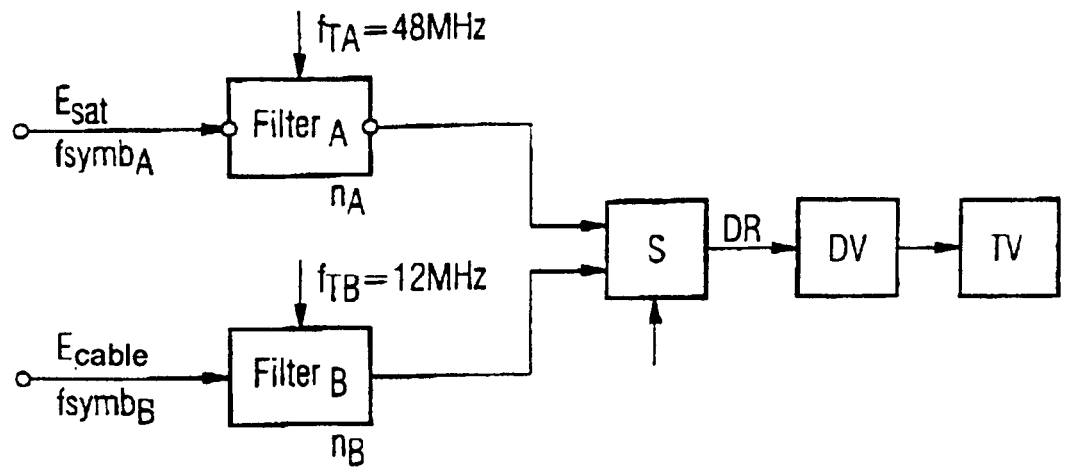
FIG. 1 shows a television receiver circuit according to the prior art.
Figure 2:
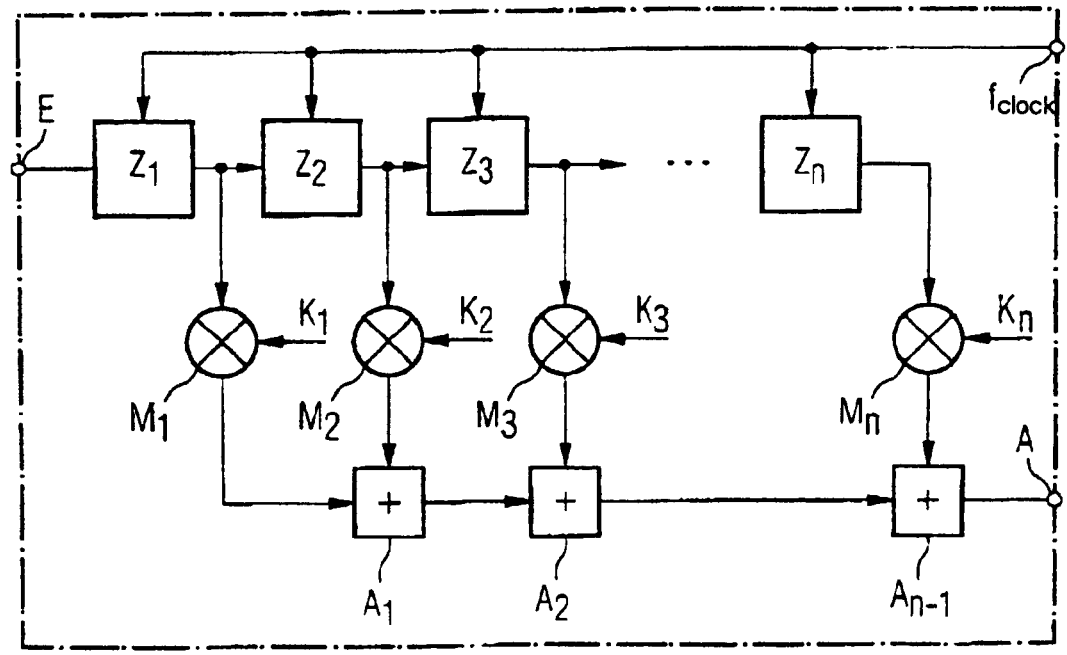
FIG. 2 shows a conventional digital FIR filter.
Figure 3:
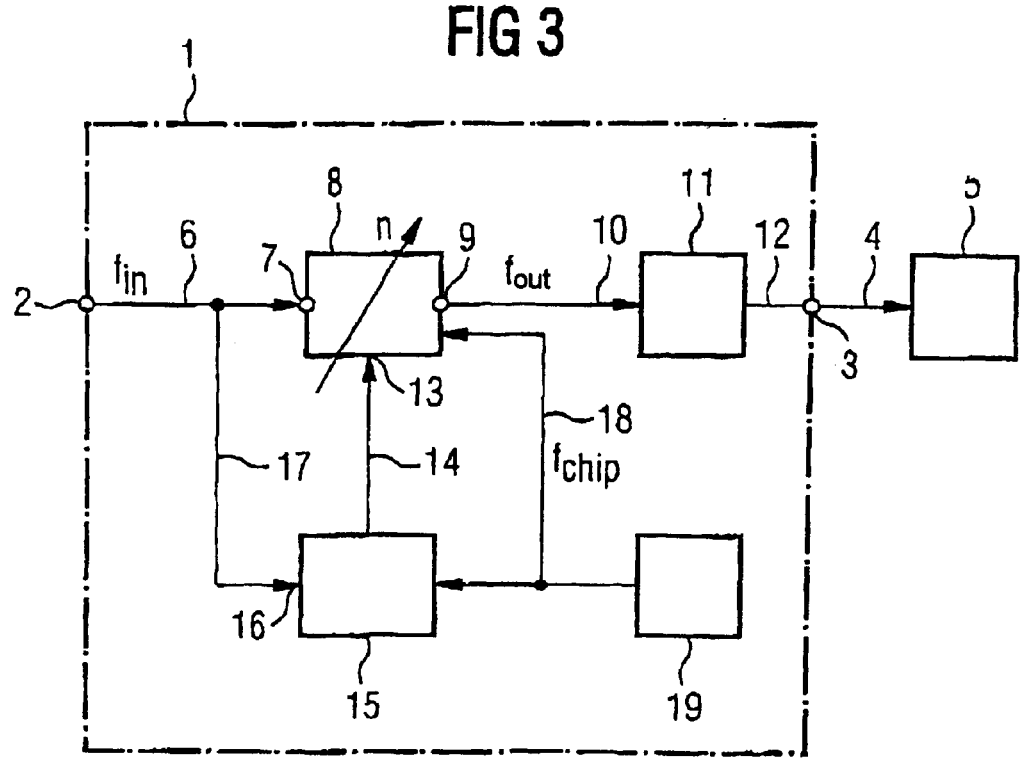
FIG. 3 shows a block circuit diagram of a television receiver in which the digital filter according to the invention is used.

FIG. 3 shows a block circuit diagram of a signal receiver circuit 1 with a signal input 2 and a signal output 3, a terminal 5, for example a television receiver, being connected to the signal output 3 via a line 4. The receiver circuit 1 is, for example, a DVB receiver circuit. The receiver circuit 1 receives, at the signal input 2, any desired digital input signal with an input clock frequency $f_{in}$ which is applied via a signal line 6 to a signal input 7 of a digital filter 8 according to the invention. The digital filter 8 according to the invention has a signal output 9 via which it outputs a filtered digital output signal with an output clock frequency $f_{out}$ via a signal line 10 to a downstream data processing circuit 11 for data processing the filtered data signals. The data processing circuit 11 is connected at the output end via a line 12 to the signal output 3 of the receiver circuit 1. The digital filter 8 according to the invention is controlled by a control circuit 15 of the receiver circuit 1 via control inputs 13 and control lines 14. The control circuit 15 receives, via a signal input 16 and a line 17, the received digital input signal for detecting the input clock frequency $f_{in}$. The digital adjustable filter 8 according to the invention receives, via chip clock lines 18, the chip clock signal with the chip clock signal $f_{chip}$ from a clock signal generator 19 of the receiver circuit 1. The control circuit 15 is also connected via a line 20 to the chip clock line 18 in order to receive the chip clock signal.

The filter length n of the digital filter 8 is switched over by the control circuit 15 as a function of the input clock frequency $f_{in}$ without the ratio between the input clock frequency $f_{in}$ and the output clock frequency $f_{out}$ of the filtered digital output signal which is output by the digital filter 8 having to change.

The following therefore applies:

$$C = \frac{f_{in}}{f_{out}} = \text{constant} \tag{6}$$

Figure 4:
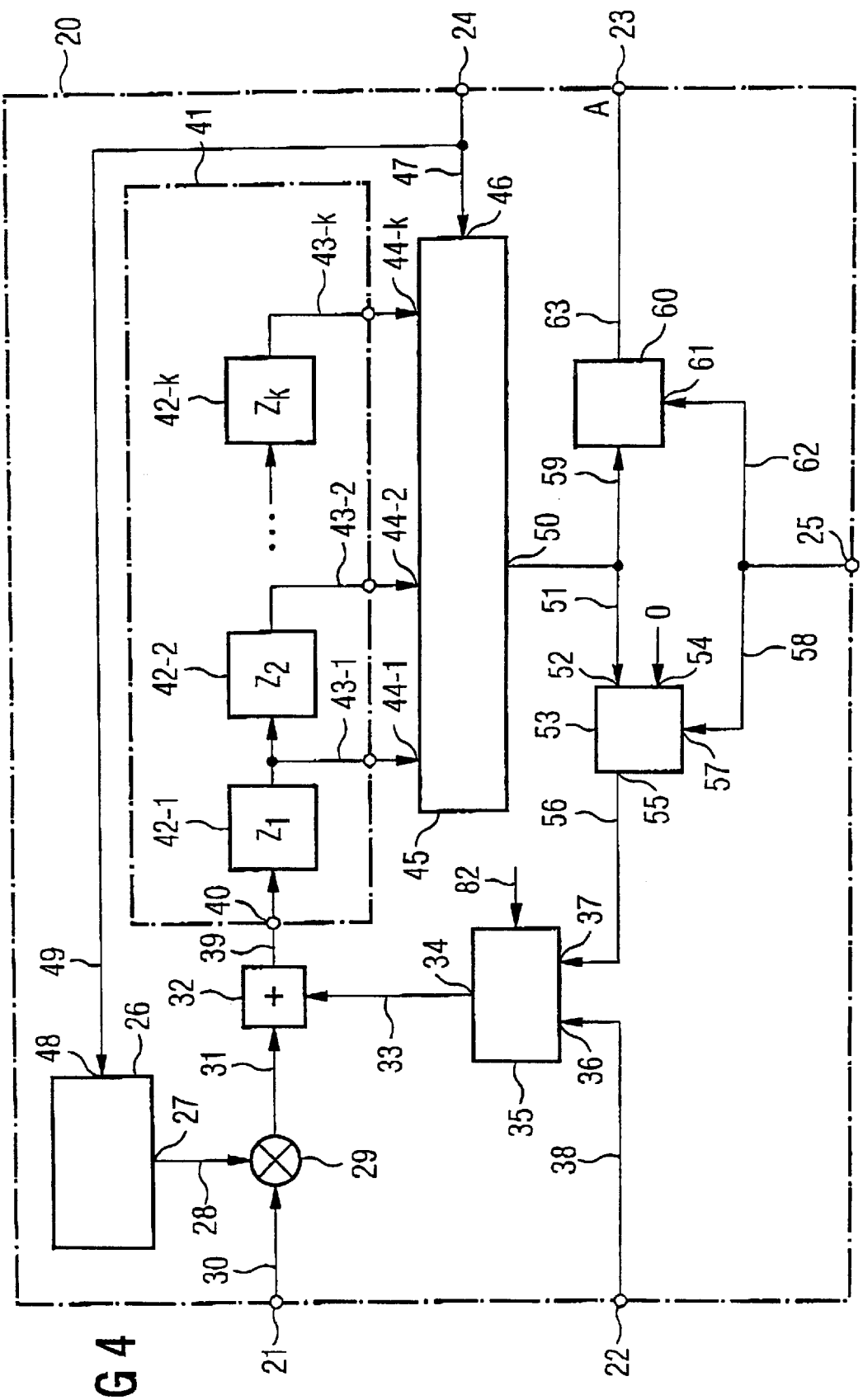
FIG. 4 shows a block circuit diagram of a digital filter module for constructing the digital filter according to the invention.

FIG. 4 shows a digital filter module 20 from which the digital filter 8 according to the invention which is illustrated in FIG. 3 is composed. The digital filter 8 comprises at least one filter module 20 here. The filter module 20 has a first signal input 21, a second signal input 22, a signal output 23, a first control input 24 and a second control input 25.

The digital filter module 20 contains a controllable filter coefficient circuit 26 which [lacuna] at an output 27 the filter coefficients via a line 28 to a multiplier device 29 for multiplication by the digital input signal to be filtered which is present at the first signal input 21. The signal input 21 is connected via a line 30 to the multiplier device 29. The multiplier device 29 is connected at the output end via a line 31 to an adder circuit 32 whose second input is connected, via a line 33, to a demultiplexer output 34 of a demultiplexer circuit 35.

The demultiplexer 35 also has two demultiplexer inputs 36, 37 the first demultiplexer input 36 being connected via a line 38 to the second signal input 22 of the filter module 20, and said demultiplexer 35 has a control input 82. The output of the adder circuit 32 is connected via a line 39 to an input 40 of a register circuit 41.

The register circuit 41 is composed of a plurality of registers 42-1, 42-2, to 42-k which are connected in series. The registers 42-i are clocked delay elements whose signal outputs are each connected via output lines 43-1, 43-2, . . . 43-k to demultiplexer inputs 44-1, 44-2, 44-k of a further demultiplexer 45. The demultiplexer 45 has a control input 46 which is connected via a line 47 to the control input 24. The filter coefficient circuit 26 also has a control input 48 which is also connected via a control line 49 to the control input 24. The demultiplexer 45 has a demultiplexer output 50 which is connected via a line 51 to an input 52 of a resetting circuit 53. The resetting circuit 53 has a further input 54 via which a logic zero can be connected to an output 55 of the resetting circuit 53, the output 55 of the resetting circuit 53 being connected to the second input 37 of the demultiplexer 35 via a line 56. The resetting switching device 53 has a control input 57 which is connected via a resetting control line 58 to the control input 25 of the digital filter module 20.

The output 50 of the demultiplexer 45 is connected via a further line 59 to a switching device 60 which is also actuated by the control input 25 via a control input 61 and a control line 62. The switching device 60 is connected at the output end to the output 23 of the digital filter module 20 via a line 63.

The demultiplexer circuit 45 and the filter coefficient circuit 26 are actuated by the control circuit 15 illustrated in FIG. 3 via the control input 24. The control signal which is present at the control input 24 indicates which demultiplexer input 44 is connected through to the demultiplexer output 50, i.e. the number of delay elements 42 connected in series is connected. In addition, the control circuit 50 connects the number of filter coefficients to be output to the multiplier device 29 by the filter coefficient circuit 26.

To do this, the control circuit 15 calculates, from the chip clock frequency $f_{chip}$ and the input clock frequency of the input signal $f_{in}$, the number j of the registers 42j connected in series, according to the following equation:

$$j = \frac{f_{Chip}}{f_{in}} \quad (7)$$

The control circuit 15 actuates the demultiplexer 44 via the control input 24 in such a way that the j-th multiplexer input 44-j is connected through to the demultiplexer output 50.

The control circuit 15 also determines the number of filter coefficients to be output to the multiplier device 29 by the filter coefficient circuit 26, i.e. the filter length n according to the following equation:

$$l = m \cdot j \cdot c \quad (8)$$

m being the number of filter modules 20, j being the number of connected-through registers 42 of the register circuit 41 which are in series, and C being an adjustable decimation factor, i.e. representing the fixed clock ratio between the input clock frequency $f_{in}$ and the output clock frequency $f_{out}$.

Table for $f_{chip}$ = 240 MHz and m = 2

| $F_{in}$/ MHz | Decimation factor C | Filter length l to be set |
|---|---|---|
| 60 | 1 | 8 |
| 48 | 1 | 10 |
| . . . | . . . | . . . |
| 24 | 1 | 20 |
| 60 | 2 | 16 |
| 48 | 2 | 20 |

-continued

Table for $f_{chip}$ = 240 MHz and m = 2

| $F_{in}$/ MHz | Decimation factor C | Filter length l to be set |
|---|---|---|
| . . . | . . . | . . . |
| 24 | 2 | 40 |
| 60 | 3 | 24 |
| 48 | 3 | 30 |
| . . . | . . . | . . . |
| 24 | 3 | 60 |

The digital filter module 20 filters the input signal present at the signal input 21 in accordance with the l filter coefficients output cyclically by the filter coefficient circuit 26, of a filter coefficient set, and accumulates the filtered value at the signal output 50 of the demultiplexer 45. After each filter coefficient cycle, the accumulated filtered value is read out to the signal output 23 of the filter module 21 via the switching device 60. To do this, the switching device 60 receives, via the control input 25, a control signal for closing the switching device 60. At the same time, the control signal is output to the resetting switching device 53 which outputs a logic zero to the output 55 in order to reset the accumulated demultiplexer output signal.

Figure 5:
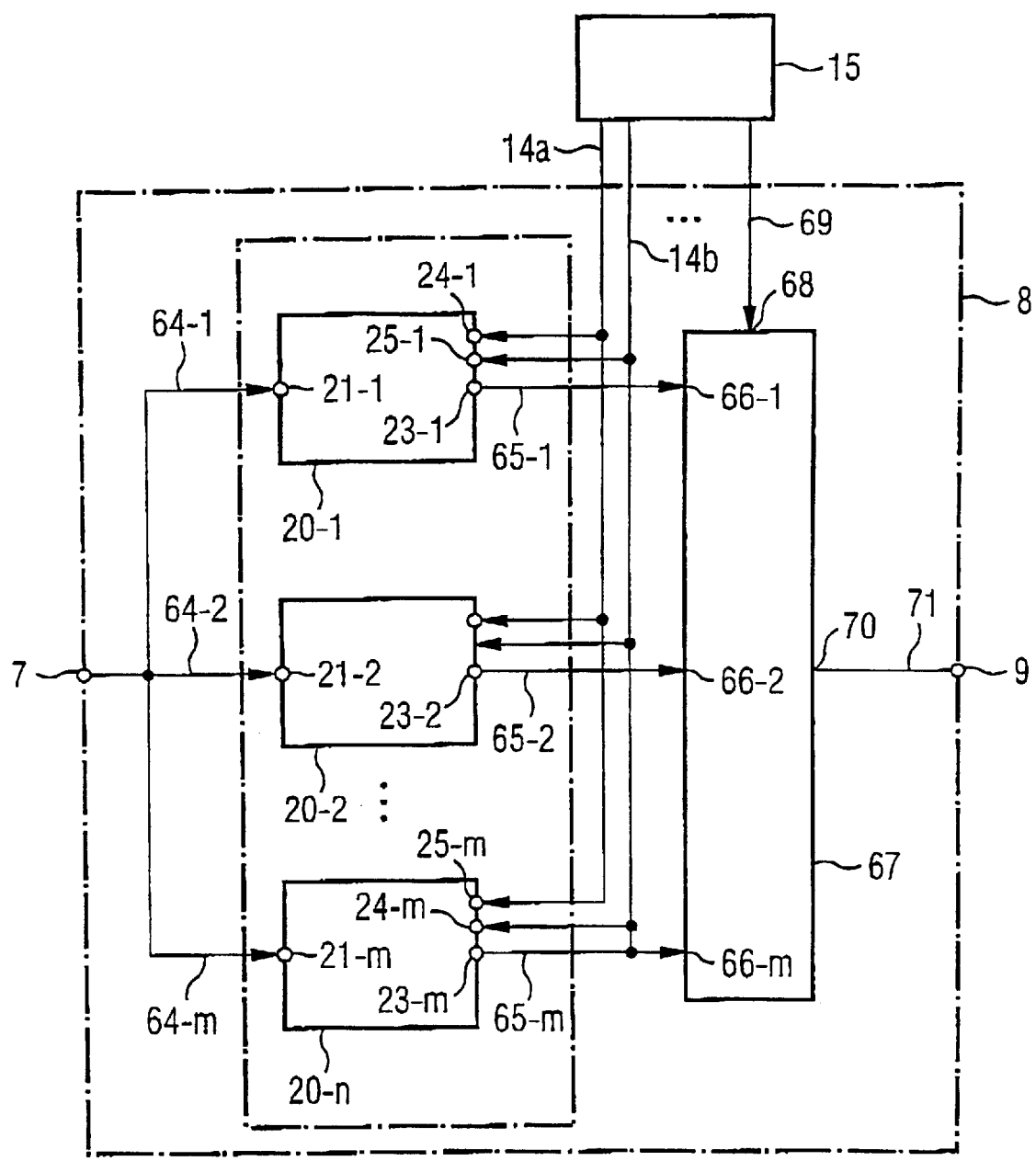
FIG. 5 shows a first embodiment of the digital filter according to the invention in which a plurality of filter modules are connected in parallel with one another.

FIG. 5 shows an embodiment of the digital filter 8 according to the invention in which a plurality of filter modules 21 are connected in parallel with one another.

The first signal inputs 21-1 to 21-m of the filter modules 20-1 to 20-m are each connected to the signal input 7 of the digital filter 8 via input signal lines 64-1 to 64-m. The signal outputs 23-1 to 23-m for the digital filter modules 20-1 to 20-m are connected via output signal lines 65-1 to 65-m to signal inputs 66-1 to 66-m of a demultiplexer 67 which is actuated by the control circuit 15 via a control input 68 and a control line 69. The control circuit 15 actuates, via control lines 14a, 14b, the control inputs 24-1 to 24-m and 25-1 to 25-m of the filter modules 20-1 to 20-m which are connected in parallel. The signal output 70 of the demultiplexer 67 is connected via an output signal line 71 to a signal output 9 of the digital filter 8 according to the invention.

Figure 6:
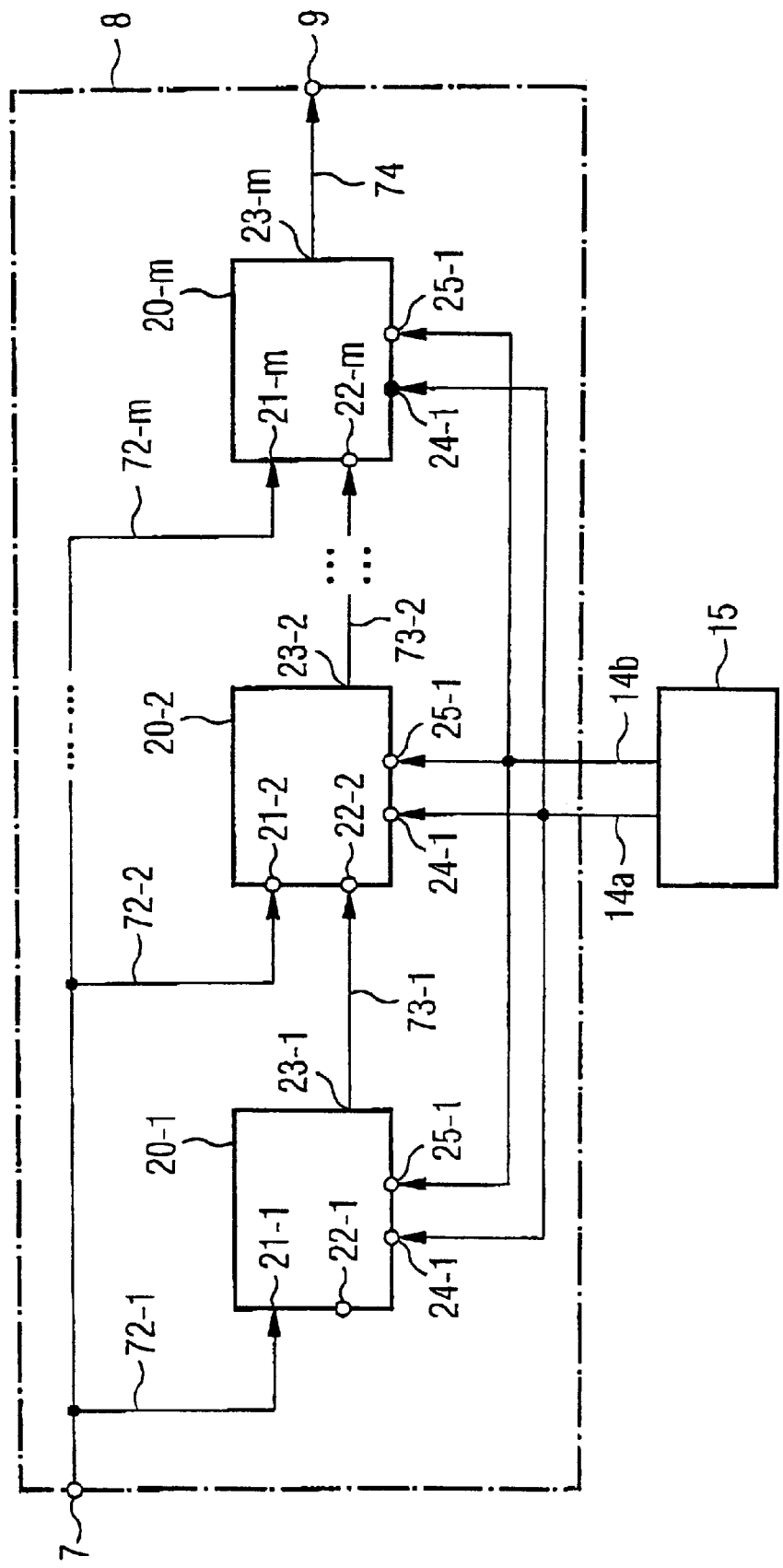
FIG. 6 shows a second embodiment of the digital filter according to the invention in which a plurality of digital filter modules are connected in series.

FIG. 6 shows an alternative embodiment of the digital filter 8 according to the invention in which a plurality of filter modules 20 are connected in series. The first signal inputs 21-1 to 21-m of the filter modules 20-1 to 20-m are connected via input signal lines 72-1 to 72-m to the signal input 7 of the digital filter 8. The signal output 23 of a filter module 20 is connected via lines 73 to, in each case, the second signal input 22 of the downstream filter module. The output 23-m of the last filter module 20-m is connected via a signal line 74 to the output 9 of the digital filter 8.

Figure 7:
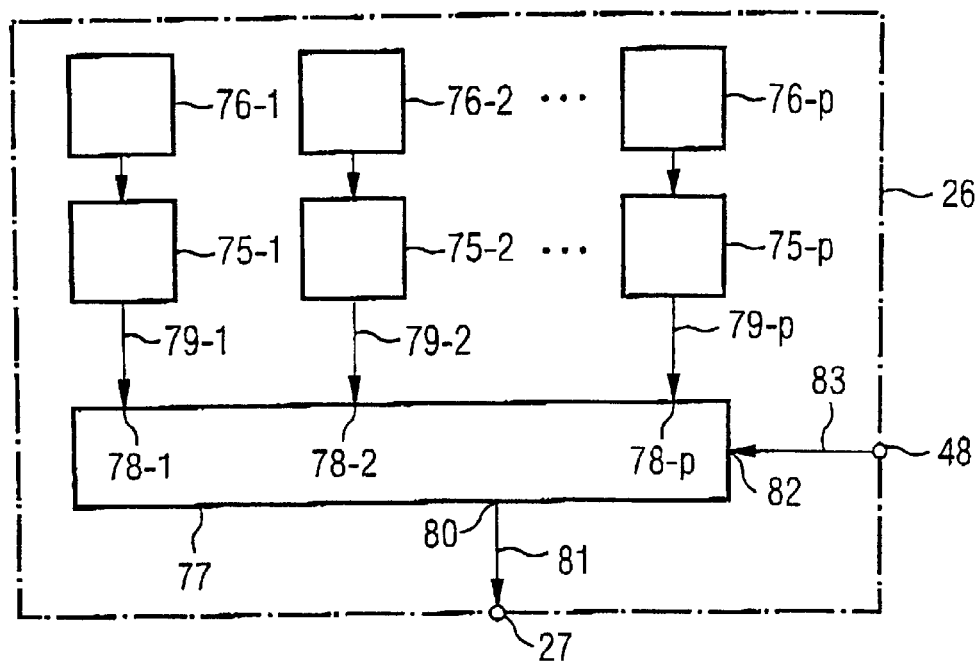
FIG. 7 shows a filter coefficient circuit in which the filter coefficients are stored in a plurality of switchable memory devices.

FIG. 7 shows a preferred embodiment of the filter coefficient circuit 26 contained in the digital filter 8 according to the invention. The filter coefficient circuit 26 has, in the embodiment shown in FIG. 7, a plurality of memories 75-1 to 75-p with associated counting devices 76-1 to 76-p in which filter coefficients are stored. Each memory 75 contains here a filter coefficient set, composed of a plurality of filter coefficients, for a specific application. The number of filter coefficients or the filter length of the filter to be implemented differs here as a function of the technical application.

The filter coefficient circuit 26 contains a demultiplexer 77 with, in each case, one demultiplexer input 78 for each memory 75. The demultiplexer inputs 78 are each connected via lines 79 to an associated memory 75. The demultiplexer 77 has a demultiplexer output 80 which is connected via a line 81 to the output 27 of the filter coefficient circuit 26. The demultiplexer 77 also has a control input 82 which is connected via a control line 83 to the control input 48 of the filter coefficient circuit 26. The filter coefficient circuit 26 receives from the control circuit 15, via the control line 49 and the control input 48, a control signal for selecting a filter coefficient memory 75 which is connected through to the output 80 of the demultiplexer 77 via the associated demultiplexer input 78. The filter coefficients stored in the filter coefficient memory 75 are read out by means of the associated memory address counting device 76 and output to the multiplier device 29, via the filter coefficient output 27, for multiplication by the input data signal. The filter coefficient memories 75 are preferably ROM memories. The counting devices 76 are NCO (Numeric Controlled Oscillator) counters which cyclically read out the cyclically stored filter coefficients.

Figure 8A:
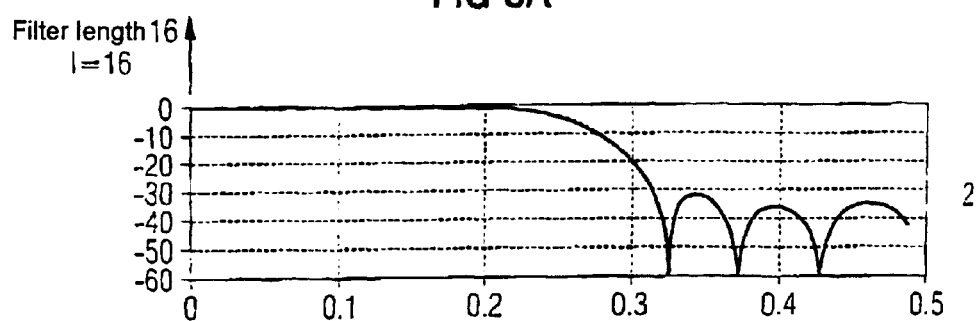
FIGS. 8a–8c show frequency responses of different digital filters according to the invention which have different filter lengths.
Figure 8B:
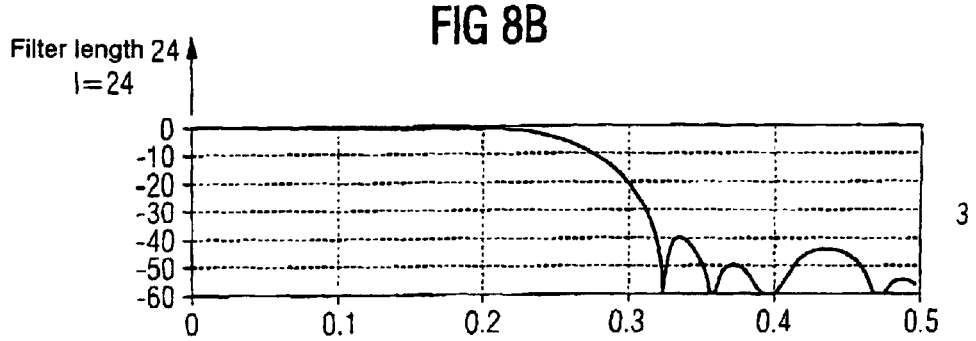
Figure 8C:
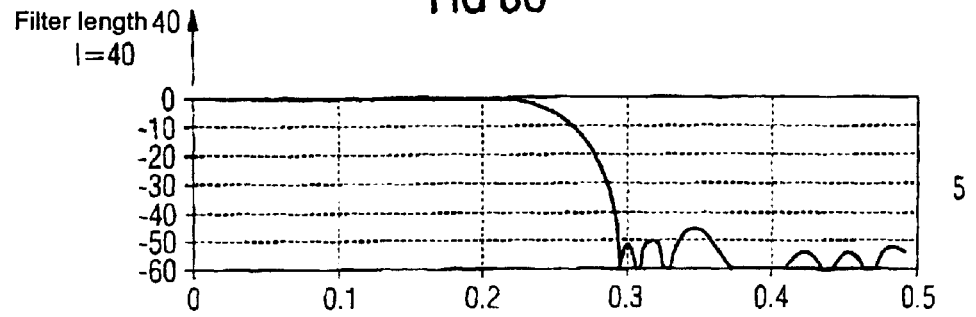

FIGS. 8a to 8c show different examples of digital filters 8 according to the invention.

FIG. 8a shows a signal diagram for a digital filter 8a according to the invention with a filter length l=16, the ratio of the chip clock frequency $f_{chip}$ to the input clock frequency $f_{in}$ being two.

FIG. 8b shows an example of a digital filter 8 according to the invention in which the filter length l is 24 and the ratio between the chip clock frequency and the input clock frequency of the input signal $f_{in}$ is three.

FIG. 8c shows a further example of a digital filter according to the invention in which the filter length l=40, and the ratio between the chip clock frequency and the input clock frequency $f_{in}$ is five.

As is clear from FIG. 4, the filter module 20 which is designated in said figure and from which the digital filter 8 according to the invention is constructed has in each case just a single multiplier device 29 so that the expenditure on circuitry to implement the filter module 20 illustrated in FIG. 4 is relatively low.

The filter length l of the filter module 20 illustrated in FIG. 4 can be switched over in a flexible way via the control circuit 15 as a function of the input clock frequency of the digital input signal by actuating the filter coefficient circuit 26 and the demultiplexer 45 via the control input 24. Here, the ratio of the input clock frequency $f_{in}$ to the output clock frequency $f_{out}$ of the filtered digital output signal which is output by the digital filter 8 is not changed. The digital filter 8 can thus be used in a flexible way for various input signals which can also be modulated in different ways. By reprogramming the stored filter coefficients, the filter module 20 can be adapted in order to filter further digital input signals without circuitry measures being necessary.

What is claimed is:

1. A digital filter for filtering a digital input signal with variable filter length l, wherein the filter length of said digital filter (8) is switchable a function of a variable input clock frequency $f_{in}$ of the digital input signal without changing in the ratio between the input clock frequency $f_{in}$ and an output clock frequency $f_{out}$ of the filtered digital output signal which is output by said digital filter (8), wherein the digital filter (8) is of modular design composed of at least one digital filter module (20) comprising:

(a) a filter coefficient circuit (26) for outputting filter coefficients to a multiplier device (29) which multiplies the filter coefficients output by said filter coefficient circuit (26) by the input data signal which is present at a first signal input (21) of the digital filter module (20), (b) an adder circuit (32) for adding the signal output by the multiplier device (29) to a multiplexer output signal which is output by a first multiplexer (45), and (c) a register circuit (41) which is composed of a plurality of registers (42) which are connected in series, the outputs of the registers (42) each being connected to an input (44) of said first multiplexer (45).

2. The digital filter as claimed in claim 1, wherein the digital filter modules (20) of the digital filter (8) are connected in parallel.

3. The digital filter as claimed in claim 1, wherein the digital filter modules (20) of the digital filter (8) are connected in series.

4. The digital filter as claimed alternative in one of the preceding claims 1 to 3, wherein the digital filter modules (20) are controlled by a control circuit (15).

5. The digital filter as claimed in claim 1, wherein the digital filter module (20) has a controllable switch (60) for reading out the multiplexer output signal, which is present at a signal output (50) of said first multiplexer (45), to an output (23) of said digital filter module (20).

6. The digital filter as claimed in claim 5, wherein the digital filter module (20) has a controllable resetting circuit (53) for resetting the multiplexer output signal which is present at the signal output (50) of said first multiplexer (45).

7. The digital filter as claimed in claim 1, wherein the digital filter module (20) has a second controllable multiplexer (35) with two multiplexer inputs (36, 37) and a multiplexer output (34), the first multiplexer input (36) being connected to a second signal input (22) of the digital filter module (20), the second multiplexer input (37) being connected to an output (55) of the resetting circuit (43) and the multiplexer output (34) being connected to the adder circuit (32).

8. The digital filter as claimed in claim 1, wherein the filter coefficient circuit (26) is a filter coefficient generating circuit for generating the filter coefficients.

9. The digital filter as claimed in one of the preceding claims 1 to 4 and claims 7 to 10, wherein the filter coefficient circuit (26) is composed of a plurality of switchable memories (75) in each of which a filter coefficient set composed of a plurality of filter coefficients is stored.

10. The digital filter as claimed in claim 1, wherein the digital input signal is a modulated QAM signal or a modulated multiple PSK signal.

11. The digital filter as claimed in claim 1, wherein the digital filter (8) filters a digital input signal of a DVB television receiver.

12. The digital filter as claimed in claim 1, wherein the filter length l can be adjusted as a function of the input clock frequency $f_{in}$ and a decimation factor (C).

* * * * *